United States Patent
Liang et al.

(10) Patent No.: US 9,419,108 B2
(45) Date of Patent: Aug. 16, 2016

(54) SEMICONDUCTOR STRUCTURE AND METHOD FOR MANUFACTURING THE SAME

(75) Inventors: Qingqing Liang, Lagrangeville, NY (US); Huicai Zhong, San Jose, CA (US); Huilong Zhu, Poughkeepsie, NY (US); Chao Zhao, Kessel-Io (BE); Tianchun Ye, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 14/406,904

(22) PCT Filed: Aug. 17, 2012

(86) PCT No.: PCT/CN2012/080328
§ 371 (c)(1),
(2), (4) Date: Jun. 22, 2015

(87) PCT Pub. No.: WO2013/189127
PCT Pub. Date: Dec. 27, 2013

(65) Prior Publication Data
US 2015/0311319 A1    Oct. 29, 2015

(30) Foreign Application Priority Data

Jun. 18, 2012 (CN) .......................... 2012 1 0206401

(51) Int. Cl.
*H01L 29/66* (2006.01)
*H01L 29/78* (2006.01)

(52) U.S. Cl.
CPC ........ *H01L 29/66795* (2013.01); *H01L 29/785* (2013.01); *H01L 29/7855* (2013.01)

(58) Field of Classification Search
CPC ............. H01L 21/84; H01L 21/28194; H01L 21/28273; H01L 21/76807; H01L 21/823431; H01L 21/823437; H01L 21/823807
See application file for complete search history.

(56) References Cited

U.S. PATENT DOCUMENTS 6,346,438 B1    2/2002  Yagishita et al.
6,504,214 B1 *  1/2003  Yu .................... H01L 21/28194
                                            257/347

(Continued)

FOREIGN PATENT DOCUMENTS

CN    102299092    12/2011

OTHER PUBLICATIONS

International Preliminary Report on Patentability (Dec. 23, 2014).

(Continued)

*Primary Examiner* — Eugene Lee
*Assistant Examiner* — Fang-Xing Jiang
(74) *Attorney, Agent, or Firm* — Goodwin Procter LLP

(57) ABSTRACT

One embodiment of present invention provides a method for manufacturing a semiconductor structure, which comprises: forming a gate stack on a semiconductor substrate and removing parts of the substrates situated on two sides of the gate stack; forming sidewall spacers on sidewalls of the gate stack and on sidewalls of the part of the substrate under the gate stack; forming doped regions in parts of the substrate on two sides of the gate stack, and forming a first dielectric layer to cover the entire semiconductor structure; selectively removing parts of the gate stack and parts of the first dielectric layer to form a channel region opening and source/drain region openings; forming a high K dielectric layer on sidewalls of the channel region opening; and implementing epitaxy process to form a continuous fin structure that spans across the channel region opening and the source/drain region openings.

5 Claims, 9 Drawing Sheets

(56) References Cited

U.S. PATENT DOCUMENTS

| | | | | |
|---|---|---|---|---|
| 6,593,187 | B1* | 7/2003 | Hsieh | H01L 21/28273 257/296 |
| 8,652,884 | B2* | 2/2014 | Zhong | H01L 21/823437 257/499 |
| 9,209,088 | B2* | 12/2015 | Eller | H01L 21/823807 |
| 9,293,377 | B2* | 3/2016 | Zhong | H01L 21/823807 |
| 2004/0140568 | A1* | 7/2004 | Fukazawa | H01L 21/76807 257/774 |
| 2006/0011986 | A1* | 1/2006 | Yagishita | H01L 21/84 257/369 |
| 2011/0127610 | A1 | 6/2011 | Lee et al. | |
| 2012/0187496 | A1 | 7/2012 | Zhong et al. | |
| 2014/0070328 | A1* | 3/2014 | Goto | H01L 21/823431 257/401 |

OTHER PUBLICATIONS

International Search Report (Mar. 28, 2013).
International Search Report.
Written Opinion (Mar. 28, 2013).

* cited by examiner

SEMICONDUCTOR STRUCTURE AND METHOD FOR MANUFACTURING THE SAME

CROSS REFERENCE TO RELATED APPLICATIONS

This application is a national stage application, filed under 35 U.S.C. §371, of PCT Application No. PCT/CN2012/080328, filed on Aug. 17, 2012, entitled "SEMICONDUCTOR STRUCTURE AND METHOD FOR MANUFACTURING THE SAME," which claimed priority to Chinese Application No. 201210206401.3, filed on Jun. 18, 2012, both of which are hereby incorporated by reference in their entireties.

FIELD OF THE INVENTION

The present invention relates to semiconductor manufacturing field, particularly, to a semiconductor structure and a method for manufacturing the same.

BACKGROUND OF THE INVENTION

It is quite promising that three-dimensional semiconductor structures, such as FINFET transistors and tri-gate field-effect transistors can be applied in 22 nm and below. Since device size is further decreased insofar as isolation between source/drain regions and gate stack in the device now becomes more and more critical.

SUMMARY OF THE INVENTION

In order to solve aforementioned technical problem, the present invention aims to provide a multi-gate field-effect transistor that enables to easily manufacture sidewall spacers for isolating source/drain regions from gate stacks, and a method for manufacturing the same.

In one aspect, the present invention provides a method for manufacturing a semiconductor structure, comprising:
a) forming a gate stack on a semiconductor substrate and removing parts of the substrates situated on two sides of the gate stack;
b) forming sidewall spacers on sidewalls of the gate stack and on sidewalls of the part of the substrate under the gate stack;
c) forming doped regions in the substrates on two sides of the gate stack, and forming a first dielectric layer to cover the entire semiconductor structure;
d) selectively removing parts of the gate stack and parts of the first dielectric layer in the direction of the width of the gate stack to form a channel region opening and source/drain region openings on two sides thereof;
e) forming a high K dielectric layer on sidewalls of the channel region opening; and
f) implementing epitaxy process to form a continuous fin structure that spans across the channel region opening and the source/drain region openings.

In the other aspect, the present invention provides a semiconductor structure, which comprises:
a substrate;
a gate stack that is situated on the substrate and extends along width direction; the gate stack comprises a dielectric layer and a gate material layer, wherein the substrate at the bottom of the gate stack is higher than the parts of substrate situated on two sides thereof;
sidewall spacers situated on sidewalls of the gate stack and on sidewalls of the part of the substrate under the gate stack;
a channel region opening situated in the gate stack and segmenting the gate stack into two parts along width direction;
a high K dielectric layer laid on sidewalls of the gate stack that are exposed through the channel region opening;
a Si fin comprising a channel region situated within the channel region opening, and source/drain regions situated on two sides thereof.

With regard to the semiconductor structure and the method for manufacturing a semiconductor structure provided in this disclosure, a multi-gate structure is formed through embedding process, such that sidewall spacers in the semiconductor structure can effectively isolate the gate from source/drain regions; besides, the sidewall spacers are formed through simple process yet are in high quality. In short, the present invention provides such a method that can effectively improve manufacturability of multi-gate (fin) devices.

BRIEF DESCRIPTION OF THE DRAWINGS

Other objectives, characteristics and advantages of the present invention are made more evident according to perusal of the following detailed description of exemplary embodiment(s) in conjunction with accompanying drawings, in which same or similar reference signs in accompanying drawings denote same or similar elements:

FIG. 2, FIG. 3(a), FIG. 4 (a), FIG. 5(a), FIG. 6(a), FIG. 7(a) and FIG. 8(a) illustrate respectively overlook views of the structure manufactured at each step according to the method for manufacturing a semiconductor structure provided by the present invention;

FIG. 3(b), FIG. 4(b), FIG. 5 (b), FIG. 6 (b), FIG. 7 (b) and FIG. 8 (b) illustrate cross-sectional diagrams along AA' direction shown in FIG. 3(a), FIG. 4 (a), FIG. 5(a), FIG. 6(a), FIG. 7(a) and FIG. 8(a);

FIG. 6(c), FIG. 7 (c) and FIG. 8 (C) illustrate respectively cross-sectional views along BB' direction shown in FIG. 6 (a), FIG. 7 (a) and FIG. 8 (a);

The same or similar reference signs in accompanying drawings denote same or similar elements.

DETAILED DESCRIPTION OF THE INVENTION

Figure 1:
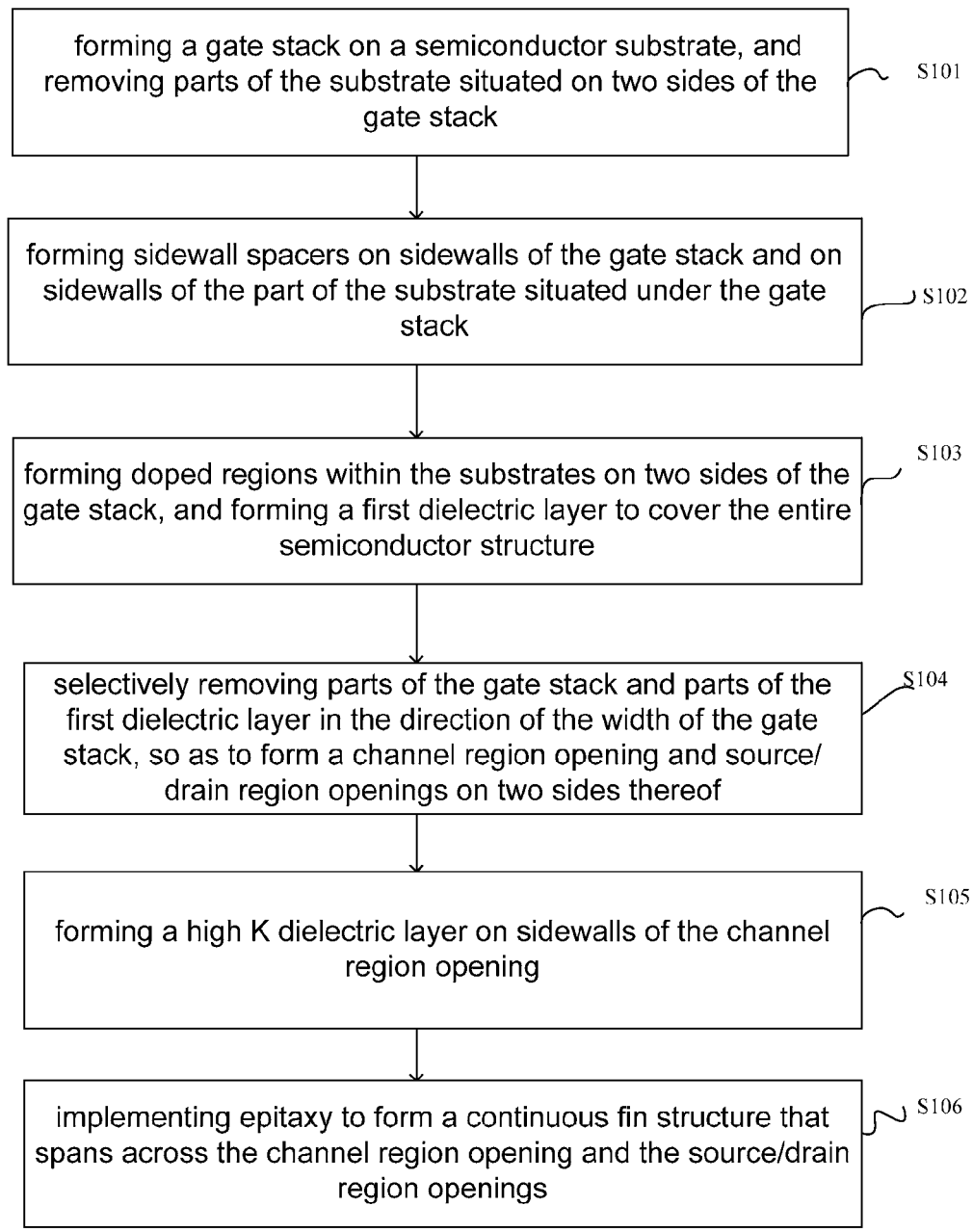
FIG. 1 shows a flowchart of an embodiment of a method for manufacturing a semiconductor structure provided by the present application.

In order to make the objects, technical solutions and advantages of the present invention more evident, detailed description of exemplary embodiment(s) in conjunction with accompanying drawings is provided here below.

Embodiments of the present invention are described in detail here below, wherein examples of the embodiments are illustrated in the drawings, in which same or similar reference signs throughout denote same or similar elements or elements have same or similar functions. It should be appreciated that the embodiments described below in conjunction with the drawings are illustrative and are provided for explaining the present invention only, thus shall not be interpreted as limits to the present invention.

Various embodiments or examples are provided here below to implement different structures of the present invention. To simplify disclosure of the present invention, descriptions of components and arrangements of specific examples are given below. Of course, they are illustrative only and are not intended to limit the present invention. Moreover, in the present invention, reference numbers and/or letters may be repeated in different embodiments. Such repetition is for purposes of simplicity and clarity, yet does not denote any relationship between respective embodiments and/or arrangements under discussion. Furthermore, the present invention provides various examples for various processes and materials. However, it is obvious for a person of ordinary skill in the art that other processes and/or materials may be utilized alternatively. In addition, the following structure in which a first feature is "on/above" a second feature may include an embodiment in which the first feature and the second feature are formed to be in direct contact with each other, and may also include an embodiment in which another feature is formed between the first feature and the second feature such that the first and second features might not be in direct contact with each other. It is noteworthy that the components shown in the drawings are not necessarily drawn to scale. Description of conventional components, processing technologies and crafts are omitted herein in order not to limit the present invention unnecessarily.

An embodiment of a method for manufacturing a semiconductor structure according to the present invention is described below in detail.

With reference to FIG. 1, which illustrates a flowchart of an embodiment of a method for manufacturing a semiconductor structure provided by the present invention, the method comprises:

at step S101, forming a gate stack on a semiconductor substrate, and removing parts of the substrate situated on two sides of the gate stack;

at step S102, forming sidewall spacers on sidewalls of the gate stack and on sidewalls of the part of the substrate situated under the gate stack;

at step S103, forming doped regions within the substrates on two sides of the gate stack, and forming a first dielectric layer to cover the entire semiconductor structure;

at step S104, removing part of the gate stack and part of the first dielectric layer in the direction of the width of the gate stack, so as to form a channel region opening and source/drain region openings on two sides thereof;

at step S105, forming a high K dielectric layer on sidewalls of the channel region opening;

at step S106, implementing epitaxy process to form a continuous fin structure that spans across the channel region opening and the source/drain region openings.

Here below, steps S101 to S104 are delineated in conjunction with FIG. 2 to FIG. 8 (d), which illustrate respectively the view of each stage at manufacturing a semiconductor structure according to the flowchart of an embodiment of the method as shown in FIG. 1. However, it is noteworthy that components shown in the drawings are intended for exemplary purposes thus are not necessarily drawn to scale.

Figure 2:
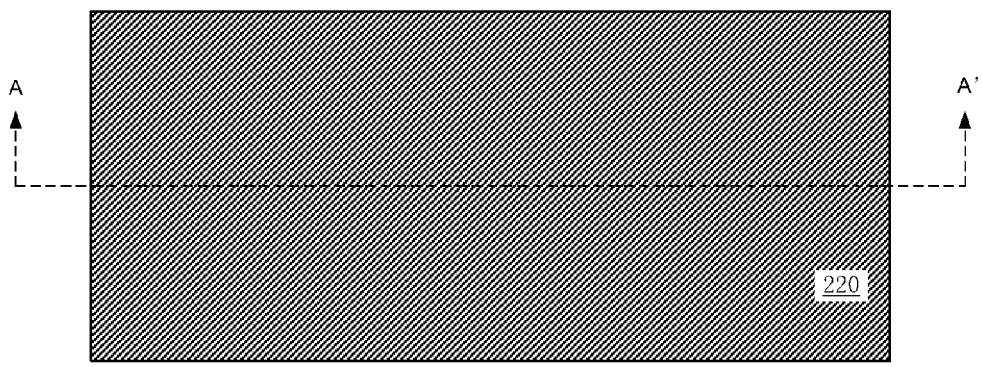

At step S101, a gate stack is formed on a semiconductor substrate, and parts of the substrate situated on two sides of the gate stack are removed. With reference to FIG. 2, a substrate 100 is provided, wherein the substrate 100 includes Si substrate (e.g. Si wafer). According to design requirements in the prior art (e.g. a P-type substrate or an N-type substrate), the substrate 100 may be of various doping configurations. The substrate 100 in other embodiments may further include other basic semiconductor, for example germanium or a compound semiconductor like SiC, GaAs, InAs or InP. Typically, the substrate 100 may have, but is not limited to, a thickness of around several hundred micrometers, which for example may be in the range of 400 μm-800 μm, for example, 400 μm, 650 μm or 800 μm.

A gate stack bottom dielectric layer 210 is formed on the substrate 100; the gate stack bottom dielectric layer 210 may be a thermal oxide layer, including $SiO_2$ or $Si_2N_2O$, for isolating gates from the substrate.

Then, a gate material layer 220 is formed on the gate stack bottom dielectric layer 210. The gate material layer 220 may be formed with a metal material, but preferably with poly Si. The metal material includes, but is not limited to, any one of TaN, TaC, TiN, TaAlN, TiAlN, MoAlN, TaTbN, TaErN, TaYbN, TaSiN, HfSiN, MoSiN, $RuTa_x$, $NiTa_x$, or combinations thereof, and the thickness thereof may be in the range of 10 nm-80 nm, for example, 30 nm, 50 nm or 80 nm.

Figure 3:
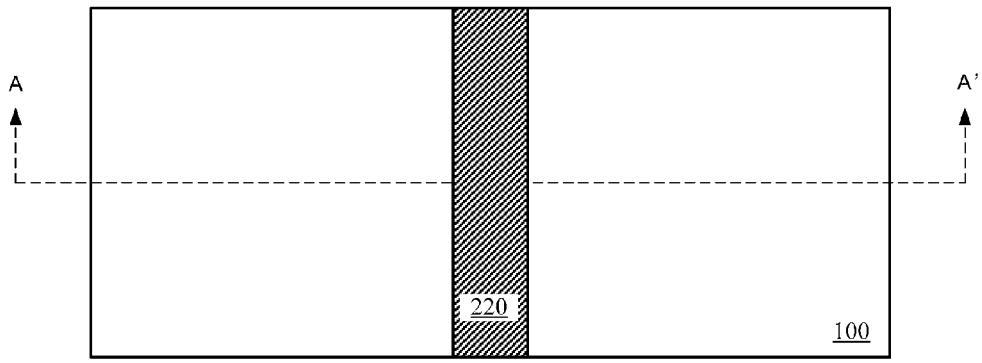
Figure 3:
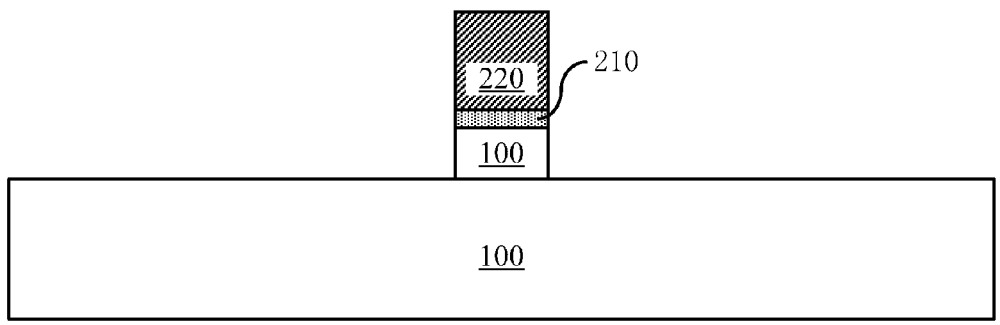

With reference to FIG. 3 (a)~FIG. 3 (b), a mask layer (not shown) is formed on the gate material layer 220 and then the mask layer is patterned. The material for the mask layer may be photo-resist, organic polymers, $SiO_2$, $Si_3N_4$, BSG, BPSG and combinations thereof. In case the mask layer is formed with photo-resist, it may be formed on the gate material layer 220 by means of spin coating and gluing, and then it is patterned through exposing and developing process. In case the mask layer is made of an organic polymer, it may be formed on the gate material layer 220 by means of spin coating and evaporating processes; while in case the mask layer is made of $SiO_2$, $Si_3N_4$, BSG or BPSG, it may be formed on the gate material layer 220 by means of chemical vapor deposition (CVD), sputtering or any other process as appropriate, and then it is patterned through dry etching or wet etching after a layer of photo-resist has been deposited as a mask. After the patterning process, the gate material layer 220 and the gate stack bottom dielectric layer 210 are etched according to the pattern so as to form a gate stack. Then, parts of the substrate on two sides of the gate stack may be removed continually, such that the part of the substrate at the bottom of the gate stack is higher than parts of the substrate on two sides thereof.

Figure 4:
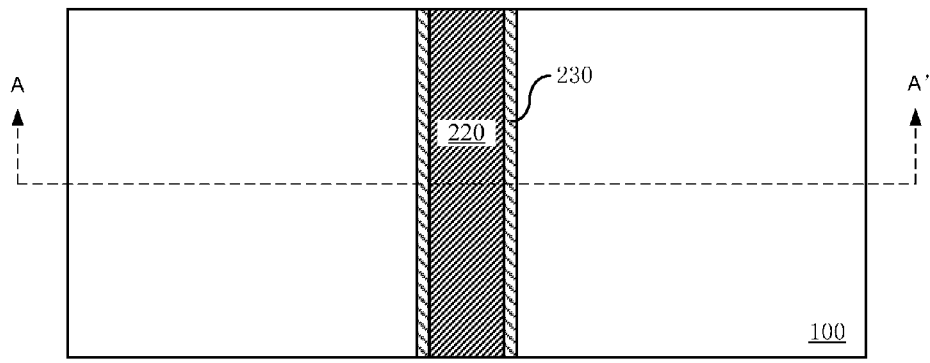
Figure 4:
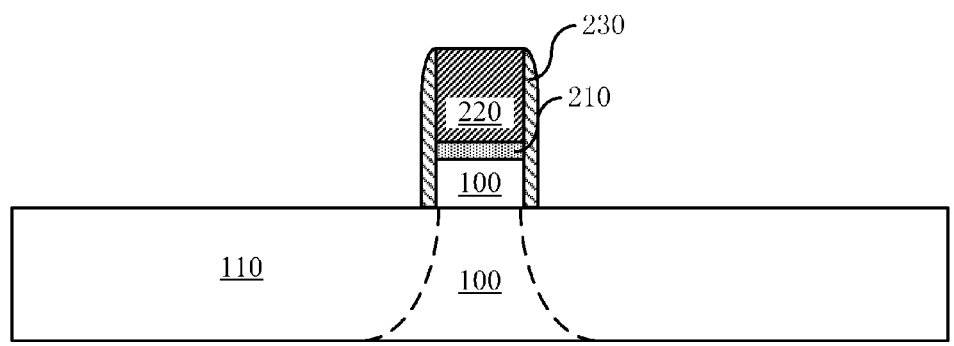

Then, step S102 is performed to form sidewall spacers on sidewalls of the gate stack and on sidewalls of parts of the substrate under the gate stack. With reference to FIG. 4 (a) and FIG. 4 (b), sidewall spacers 230 are formed on sidewalls of the gate stack and on sidewalls of parts of the substrate under the gate stack, so as to isolate the gate stack. The sidewall spacers 230 may be formed with $Si_3N_4$, $SiO_2$, $Si_2N_2O$, SiC and combinations thereof, and/or other materials as appropriate. The sidewall spacers 230 may be in multi-layer structure. The sidewall spacers 230 may be formed by means of depositing and etching processes, and the thickness of the sidewall spacers 230 may be in the range of 10 nm~100 nm, for example, 10 nm, 50 nm or 100 nm.

At step S103, doped regions are formed in substrates on two sides of the gate stack, and a first dielectric layer is formed to cover the entire semiconductor structure. Source/drain doped dopants source region 110 is formed, and the source/drain doped dopants source region 110 may be formed through implanting P-type or N-type dopants or impurities into the substrate 100. For example, the source/drain doped dopants source region 110 may be P-type doped for PMOS, while the source/drain doped dopants source region 110 may be N-type doped for NMOS. The source/drain doped dopants source region 110 may be formed by means of lithography, ion implantation, diffusion, epitaxy and/or any other process as appropriate. In the present embodiment, source/drain doped dopants source region 110 is formed preferably by way of ion implantation. In the subsequent steps of forming a Si fin, doped ions in the source/drain doped dopants source region 110 will diffuse into the Si fin so as to form source/drain regions in the Si fin by means of self-alignment.

Optionally, the semiconductor structure is annealed to activate impurities in source/drain doped dopants source region 110. The semiconductor structure that has been readily formed is annealed by means of, for example, laser annealing, flash annealing or the like, so as to activate impurities in the semiconductor structure. In an embodiment, the semiconductor structure is annealed through instant annealing process, for example, laser annealing at high temperature around 800° C.–1100° C.

Figure 5:
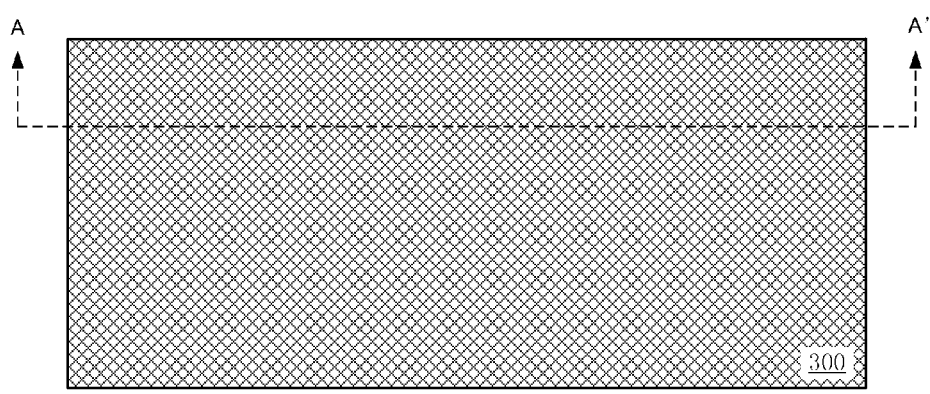
Figure 5:
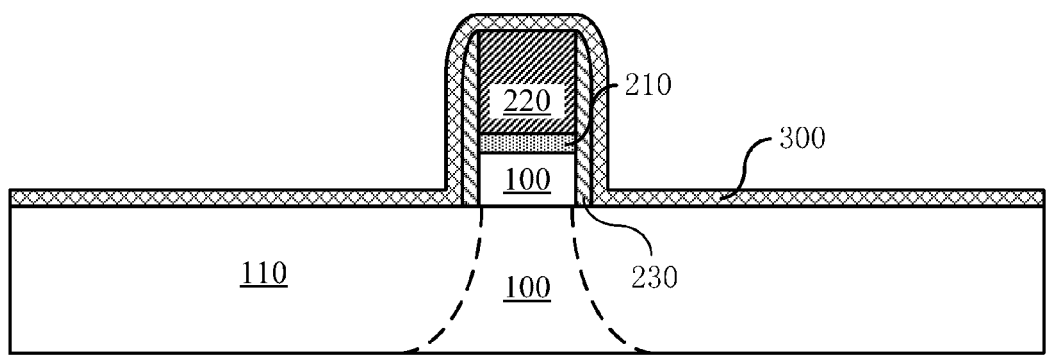

With reference to FIG. 5 (a)–FIG. 5 (b), a first dielectric layer 300, for example an oxide liner layer, is formed on the surface of the semiconductor structure. The first dielectric layer 300 may be formed on the surface of the semiconductor structure by means of CVD, high-density plasma CVD, spin coating or any other process as appropriate. The material for the first dielectric layer 300 may include $SiO_2$, carbon doped $SiO_2$, BPSG, PSG, UGS, $Si_2N_2O$, a low K material or combinations thereof. The thickness of the first dielectric layer 300 may be in the range of 40 nm~150 nm, for example, 80 nm, 100 nm or 120 nm.

Figure 6:
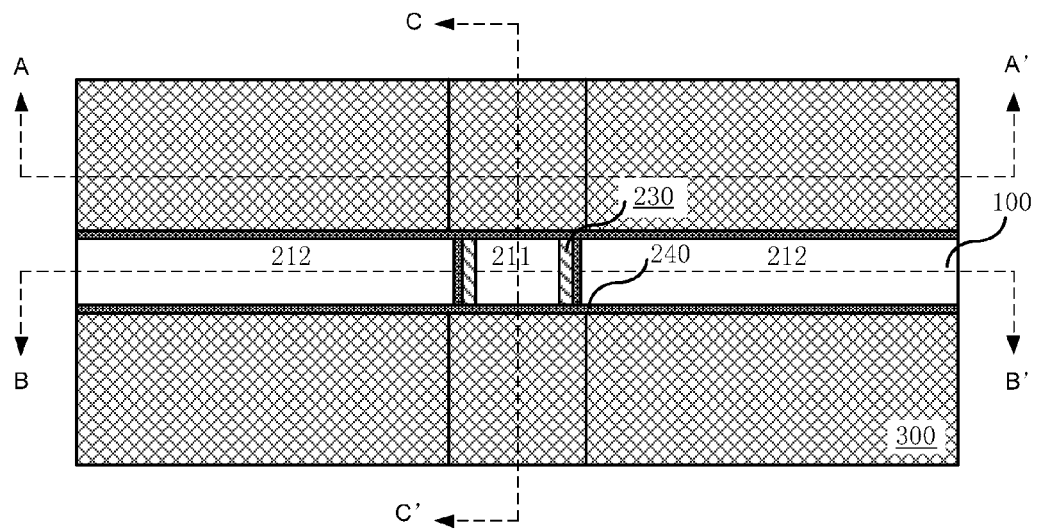
FIG. 6 (d), FIG. 7 (d) and FIG. 8 (d) illustrate respectively cross-sectional views along CC' direction shown in FIG. 6 (a), FIG. 7 (a) and FIG. 8(a).
Figure 6:
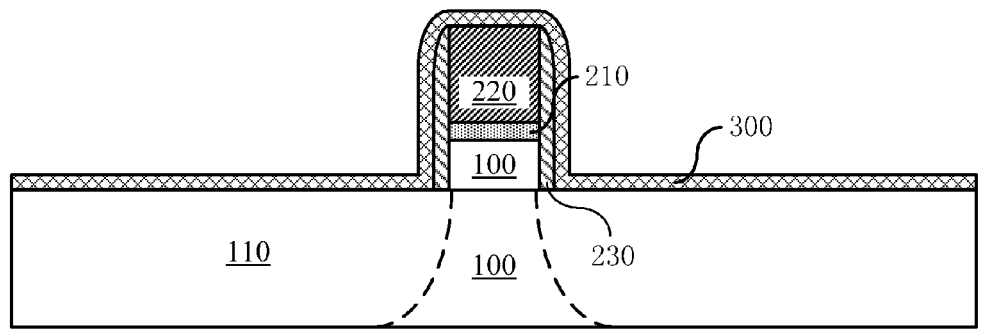
Figure 6:
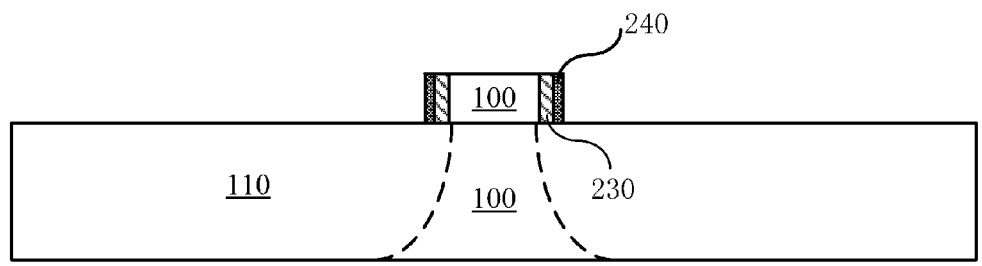
Figure 6:
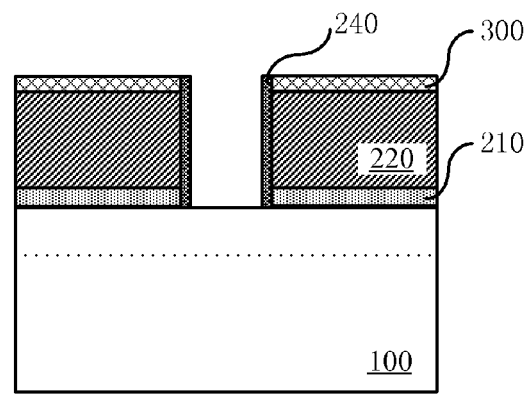
Figure 7:
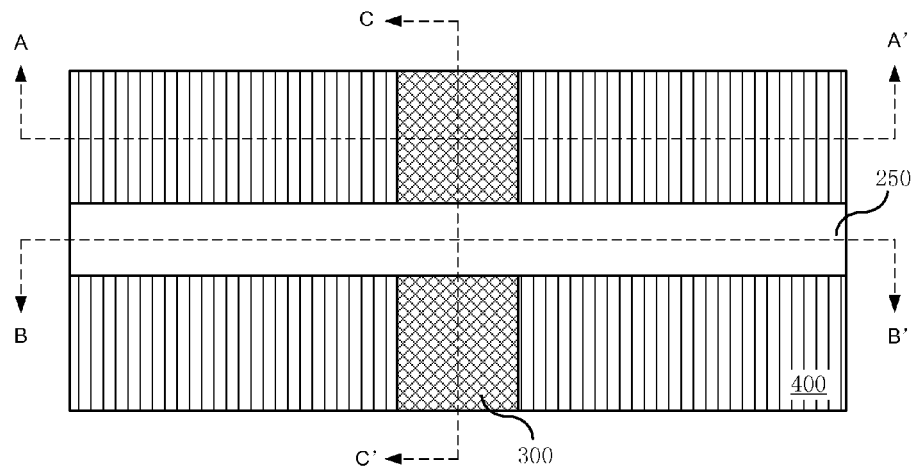
Figure 7:
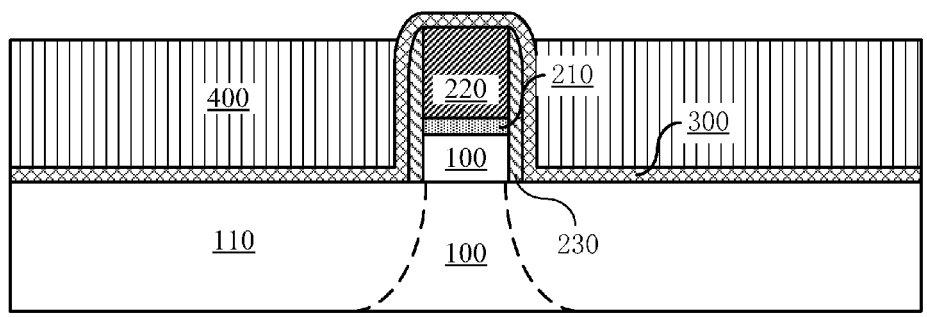
Figure 7:
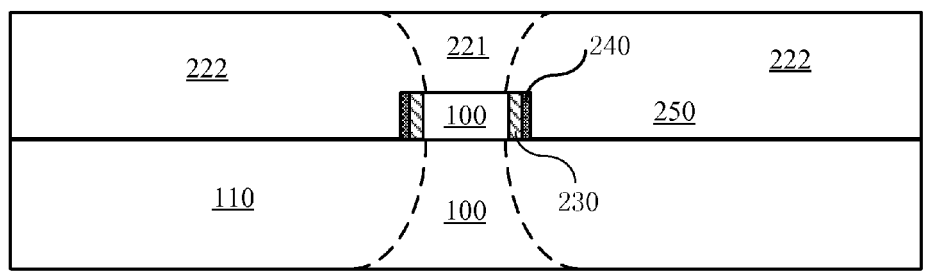
Figure 7:
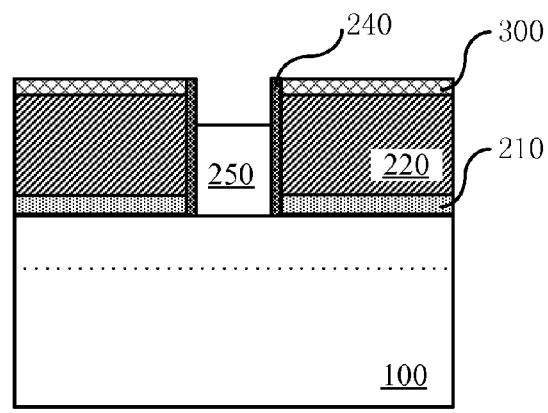

At step S104, parts of the gate stack and parts of the first dielectric layer are selectively removed in the direction of the width of the gate stack to form a channel region opening 211 and source/drain region openings 212 on two sides thereof. With reference to FIG. 6 (a)–FIG. 6(d), the first dielectric layer 300 is selectively etched in the direction of the width of the gate stack. Optionally, a mask layer is formed and then patterned. Since the process and material for forming the mask layer have already been delineated in foregoing disclosure, thus they are not described here in detail in order not to obscure. After the patterning process has been finished, the first dielectric layer 300 is etched according to the pattern resulted from the patterning process; parts of the gate stack and parts of the first dielectric layer are selectively removed in the direction of the width of the gate stack (CC' direction), so as to form the channel region opening 211 and source/drain region openings 212 on two sides thereof, which thence expose parts of the substrate 100 and sidewall spacers 230. As shown in FIG. 6 (a), the gate stack is segmented into two independent parts by the channel region opening 211 in width direction, such that the gate material layer is exposed through the opening 211.

Next, step S105 is performed to form a high K dielectric layer 240 on sidewalls of the channel region opening 211. The high K dielectric layer 240 is formed on the exposed gate material layer to function as a gate dielectric layer. The material for the high K dielectric layer 240 may be, for example, any one of HfAlON, HfSiAlON, HfTaAlON, HfTiAlON, HfON, HfSiON, HfTaON, HfTiON and combinations thereof.

Next, step S106 is performed to form a continuous fin structure that spans across the channel region opening 211 and the source/drain region openings 212 by means of epitaxial growing process, as shown in FIG. 7(a)–FIG. 7(d). Since epitaxy process is implemented onto the exposed single crystal substrate, thus a fin structure, which spans across the channel region opening 211 and the source/drain region openings 212, is formed upwards at the channel region opening 211 and the source/drain region openings 212. In other regions, since epitaxy process is implemented on the first dielectric layer, thus regions of polycrystalline materials are formed. During implementation of the epitaxy process, impurities that have been implanted into the source/drain doped dopants source region 110 are diffused upwards into the fin structure at the source/drain openings 212, so as to form source/drain regions 222 in the fin structure by means of self-alignment, as shown in FIG. 7 (c). The part of the fin structure situated in the channel region opening 211 becomes a channel region 221. After implementation of the epitaxy process, planarization is implemented to the entire semiconductor structure, and silicon gone through the expitiaxy process is then etched, as shown in FIG. 7 (b) and FIG. 7 (d).

Figure 8:
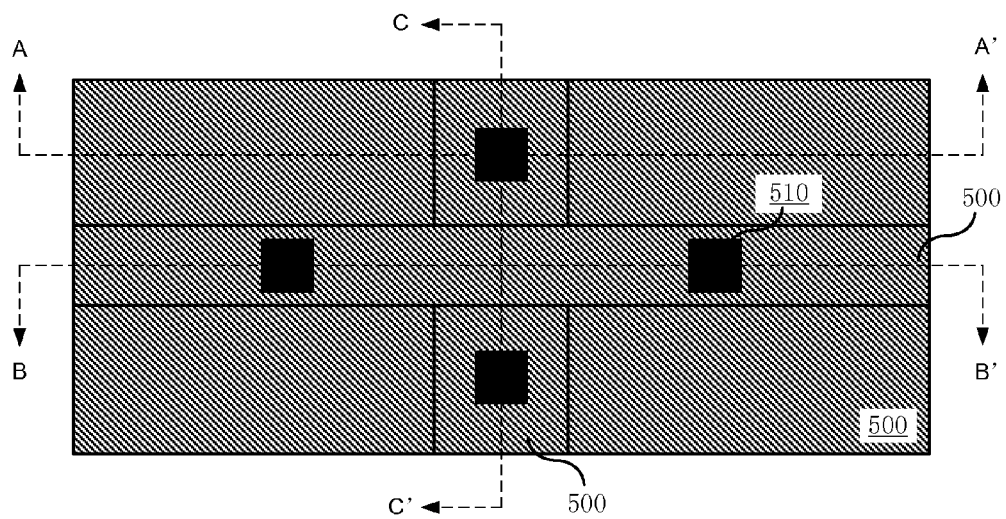
Figure 8:
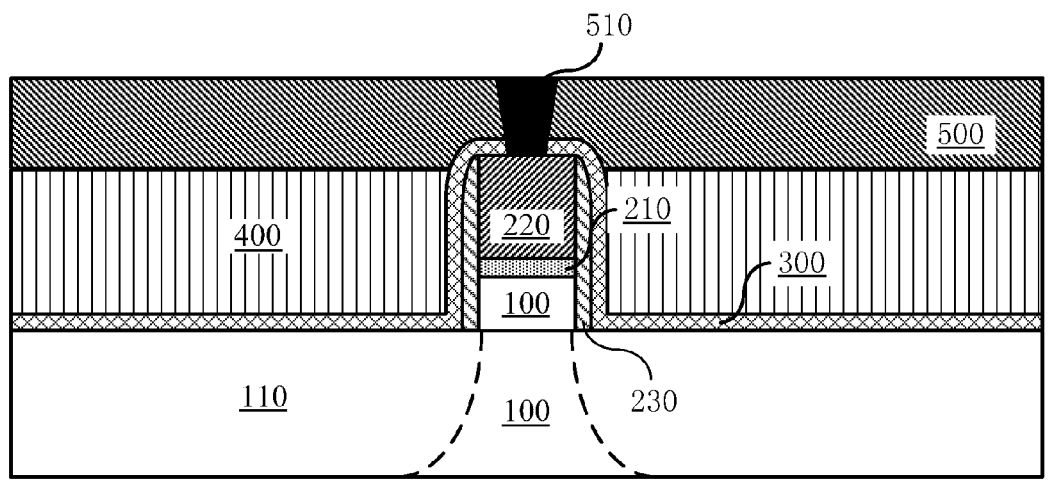
Figure 8:
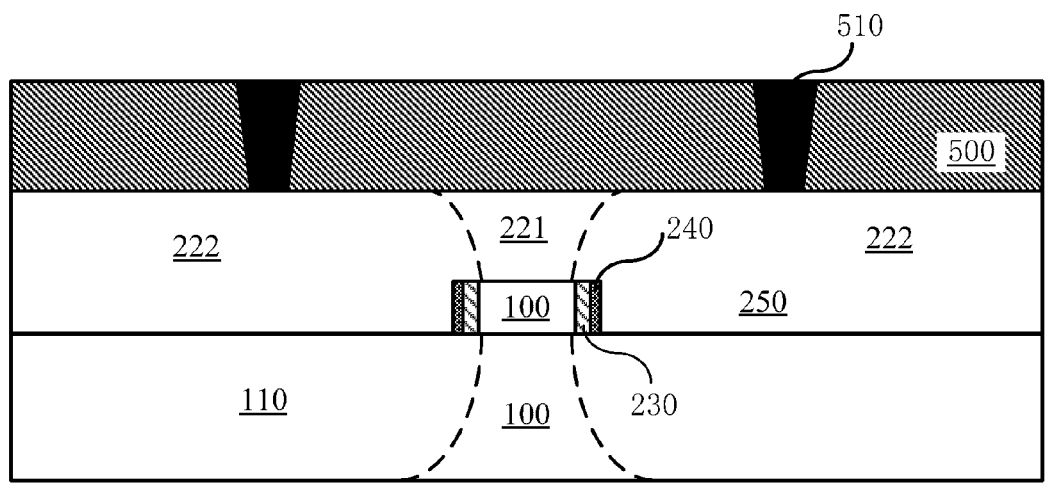
Figure 8:
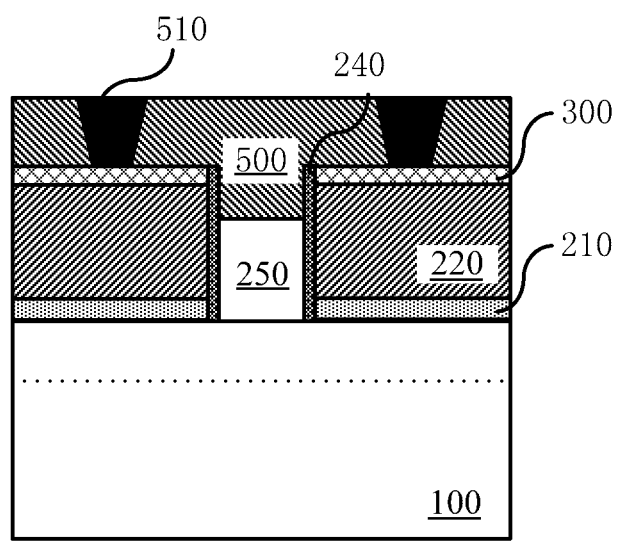

Optionally, with reference to FIG. 8 (a)–FIG. 8 (d), contact plugs 510 are formed. Firstly, a second dielectric layer 500 is formed to cover aforesaid semiconductor structure; then, contact holes, which at least expose parts of the gate material layer 220 and the fin structure 250, are formed in the second dielectric layer 500. Specifically, the contact holes may be formed through etching the second dielectric layer 500 by means of dry etching, wet etching or any other etching process as appropriate.

Situated below the contact holes are the exposed gate material layer 220 and the fin structure 250, on which metal is then deposited and annealed to form a metal silicide. Specifically, firstly, pre-amorphization is performed to the exposed gate material layer 220 and the fin structure 250 via the contact holes by means of ion implanting, depositing amorphous compounds or selectively growing process, so as to form partially amorphous regions; then, a uniform metal layer is formed on the gate material layer 220 and the fin structure 250 by means of sputtering of metal or chemical vapor depositing (CVD). Preferably, the metal may be Ni. Of course, any other metal as appropriate also may be used, for example, Ti, Co or Cu. Then, the semiconductor structure is annealed; while other annealing processes, such as rapid thermal annealing, spike annealing may be used in other embodiments. According to embodiments of the present invention, instant annealing process is applied to anneal the device, for example, laser annealing is carried out at temperature above 1000° C. for a period of microseconds, such that the deposited metal reacts with the amorphous compounds formed in the gate material layer 220 and the fin structure 250 to form a metal silicide; finally, the deposited metal left from reaction may be removed by means of chemical etching. The amorphous compounds may be any one of amorphous Si, amorphous SiGe or amorphous SiC. Formation of metal silicide is favorable for reducing contact resistance between the contact metal and the fin structure 250 and the gate material layer within the contact plugs.

It is noteworthy that the step for forming the metal silicide is a preferred step; namely, rather than forming a metal silicide, it is also applicable to fill metal directly into the contact holes to form contact plugs 510.

Contact metal is filled directly into the contact holes to form contact plugs 510 by means of deposition. The contact metal goes through the second dielectric layer 500 via the contact holes till its top part becomes exposed. Preferably, the material for the contact metal is W. Of course, according to the needs in manufacturing semiconductors, the material for the contact metal includes, but is not limited to, any one or combination of W, Al, TiAl alloy. Optionally, prior to filling contact metal, it is applicable to form a liner layer (not shown) onto the interior walls of the contact holes and the bottom of the contact holes, and the liner layer may be formed onto the interior walls of the contact holes and the bottom thereof by means of depositions such as ALD, CVD, PVD, the material for the liner layer may be Ti, TiN, Ta, TaN, Ru or combination thereof, and the thickness of the liner layer may be in the range of 5 nm~20 nm, for example 10 nm or 15 nm.

In implementation of the method for manufacturing a semiconductor provided by the present invention, sidewall spacers of high quality are formed to isolate gates from source/drain regions, thereby improving performance of the semiconductor device.

The semiconductor structure manufactured according to the method provided by the present invention is described below in detail.

With reference to FIG. 8 (*a*)~FIG. 8 (*d*), the semiconductor structure comprises: a substrate 100; a gate stack that is situated on the substrate 100 and extends along the width direction; the gate stack comprises a dielectric layer 210 and a gate material layer 220, wherein the part of the substrate at the bottom of the gate stack is higher than parts of the substrate situated on two sides thereof; sidewall spacers 230 situated on sidewalls of the gate stack and on sidewalls of the part of the substrate under the gate stack; a channel region opening that is situated within the gate stack and segments the gate stack into two parts; a high K dielectric layer 240 laid on sidewalls of the gate stack that have been exposed through the channel region opening; a Si fin 250 comprising a channel region 221 situated inside the channel region opening, and source/drain regions 222 situated on two sides thereof.

The substrate 100 includes Si substrate (e.g. Si wafer). According to design requirements in the prior art (e.g. a P-type substrate or an N-type substrate), the substrate 100 may be of various doping configurations. The substrate 100 in other embodiments may further include other basic semiconductor, for example germanium or a compound semiconductor like SiC, GaAs, InAs or InP. Typically, the substrate 100 may have, but is not limited to, a thickness of around several hundred micrometers, which for example may be in the range of 400 µm-800 µm.

The gate stack bottom dielectric layer 210 may be a thermal oxide layer, including $SiO_2$ or $Si_2N_2O$. The gate material layer 220 may be made of a metal material, which is preferably poly Si. The metal material include, but is not limited to, any one of TaN, TaC, TiN, TaAlN, TiAlN, MoAlN, TaTaN, TaErN, TaYbN, TaSiN, HfSiN, MoSiN, $RuTa_x$, $NiTa_x$, or any combination thereof.

The sidewall spacers 230 may be made of $Si_3N4$, $SiO_2$, $Si_2N_2O$, SiC and combinations thereof, and/or any other material as appropriate.

The high K dielectric layer 240 is made of any one or a combination of HfAlON, HfSiAlON, HfTaAlON, HifiAlON, HfON, HfSiON, HfTaON, HfTiON.

Optionally, the semiconductor structure may further comprise a second dielectric layer 500 and contact plugs 510 formed within the second dielectric layer 500. The material for the second dielectric layer 500 may include $SiO_2$, carbon doped $SiO_2$, BPSG, PSG, UGS, $Si_2N_2O$, a low K material and any combination thereof.

The contact metal for the contact plugs 510 is preferably W. According to the needs in manufacturing semiconductors, the material for the contact metal includes, but is not limited to, any one or a combination of W, Al, TiAl alloy.

Although the exemplary embodiments and their advantages have been described at length herein, it should be understood that various alternations, substitutions and modifications may be made to the embodiments without departing from the spirit of the present invention and the scope as defined by the appended claims. As for other examples, it may be easily appreciated by a person of ordinary skill in the art that the order of the process steps may be changed without departing from the scope of the present invention.

In addition, the scope, to which the present invention is applied, is not limited to the process, mechanism, manufacture, material composition, means, methods and steps described in the specific embodiments in the specification. According to the disclosure of the present invention, a person of ordinary skill in the art should readily appreciate from the disclosure of the present invention that the process, mechanism, manufacture, material composition, means, methods and steps currently existing or to be developed in future, which perform substantially the same functions or achieve substantially the same as that in the corresponding embodiments described in the present invention, may be applied according to the present invention. Therefore, it is intended that the scope of the appended claims of the present invention includes these process, mechanism, manufacture, material composition, means, methods or steps.

What is claimed is:

1. A method for manufacturing a semiconductor structure, comprising:
   a) forming a gate stack on a semiconductor substrate (100) and removing parts of the substrates situated on two sides of the gate stack;
   b) forming sidewall spacers (230) on sidewalls of the gate stack and on sidewalls of the part of the substrate (100) under the gate stack;
   c) forming doped regions (110) in substrates on two sides of the gate stack, and forming a first dielectric layer (300) to cover the entire semiconductor structure;
   d) selectively removing parts of the gate stack and parts of the first dielectric layer (300) in the direction of the width of the gate stack to form a channel region opening (211) and source/drain region openings (212) on two sides thereof;
   e) forming a high K dielectric layer (240) on sidewalls of the channel region opening (211); and
   f) implementing epitaxy process to form a continuous fin structure (250) that spans across the channel region opening (211) and the source/drain region openings (212).

2. The method of claim 1, wherein the gate stack comprises upwards a layer of $SiO_2$ (210) and a poly Si layer (220).

3. The method of claim 1, wherein the material for the sidewall spacers (230) is $Si_3N_4$.

4. The method of claim 1, wherein the high K dielectric layer (240) comprises any one or a combination of HfAlON, HfSiAlON, HfTaAlON, HfTiAlON, HfON, HfSiON, HfTaON, HfTiON.

5. The method of claim 1 further comprising, after the step f), planarizing the entire semiconductor structure and forming contact plugs on the fin structure and the gate stack.

* * * * *